(12) United States Patent
Hurwitz et al.

(10) Patent No.: US 9,554,469 B2
(45) Date of Patent: Jan. 24, 2017

(54) METHOD OF FABRICATING A POLYMER FRAME WITH A RECTANGULAR ARRAY OF CAVITIES

(71) Applicant: Zhuhai Advanced Chip Carriers & Electronic Substrate Solutions Technologies Co. Ltd., Zhuhai (CN)

(72) Inventors: Dror Hurwitz, Zhuhai (CN); Alex Huang, Zhuhai (CN)

(73) Assignee: Zhuhai Advanced Chip Carriers & Electronic Substrate Solutions Technologies Co. Ltd., Zhuhai (CN)

( * ) Notice: Subject to any disclaimer, the term of this patent is extended or adjusted under 35 U.S.C. 154(b) by 8 days.

(21) Appl. No.: 14/561,719

(22) Filed: Dec. 5, 2014

(65) Prior Publication Data

US 2016/0165731 A1    Jun. 9, 2016

(51) Int. Cl.
| | | |
|---|---|---|
| H05K 1/09 | (2006.01) |
| H05K 1/18 | (2006.01) |
| H05K 1/02 | (2006.01) |
| H05K 1/03 | (2006.01) |
| H05K 1/11 | (2006.01) |
| C23F 1/02 | (2006.01) |

(52) U.S. Cl.
CPC ............ *H05K 1/183* (2013.01); *H05K 1/0298* (2013.01); *H05K 1/0373* (2013.01); *H05K 1/09* (2013.01); *H05K 1/115* (2013.01); *C23F 1/02* (2013.01)

(58) Field of Classification Search
CPC .... H05K 1/183; H05K 1/0373; H05K 1/0298; H05K 1/09; H05K 1/115; C23F 1/02
See application file for complete search history.

(56) References Cited

U.S. PATENT DOCUMENTS

| | | | | |
|---|---|---|---|---|
| 5,897,728 A | * | 4/1999 | Cole .................. | G01R 1/04 156/155 |
| 2003/0029921 A1 | * | 2/2003 | Akita ............... | G06K 19/07718 235/492 |
| 2012/0091594 A1 | * | 4/2012 | Landesberger ..... | H01L 23/3121 257/774 |

* cited by examiner

*Primary Examiner* — Kyoung Lee
(74) *Attorney, Agent, or Firm* — Wiggin and Dana LLP; Gregory S. Rosenblatt; Jonathan D. Hall (57) ABSTRACT

An array of chip sockets defined by an organic matrix framework surrounding sockets through the organic matrix framework and a method of fabrication, the chip sockets are characterized by being rectangular with smooth walls that meet at corners that have radii of curvature of less than 100 microns thereby facilitating a close fit of each socket to the intended chip size, enabling compact chip packaging and miniaturization.

37 Claims, 10 Drawing Sheets

NEW SHEET

METHOD OF FABRICATING A POLYMER FRAME WITH A RECTANGULAR ARRAY OF CAVITIES

BACKGROUND

Field of the Disclosure

The present invention is directed to a polymer frame that may be used, inter alia for chip packaging, specifically to embedded chips.

Description of the Related Art

Driven by an ever greater demand for miniaturization of ever more complex electronic components, consumer electronics such as computing and telecommunication devices are becoming ever more integrated. This has created a need for support structures such as IC substrates and IC interposers that have a high density of multiple conductive layers and vias that are electrically insulated from each other by a dielectric material.

The general requirement for such support structures is reliability and appropriate electrical performance, thinness, stiffness, planarity, good heat dissipation and a competitive unit price.

Of the various approaches for achieving these requirements, one widely implemented manufacturing technique that creates interconnecting vias between layers uses lasers to drill holes through the subsequently laid down dielectric substrate through to the latest metal layer for subsequent filling with a metal, usually copper, that is deposited therein by a plating technique. This approach to creating vias is sometimes referred to as 'drill & fill', and the vias created thereby may be referred to as 'drilled & filled vias'.

There are a number of disadvantages with the drilled & filled via approach. Since each via is required to be separately drilled, the throughput rate is limited, and the costs of fabricating sophisticated, multi-via IC substrates and interposers becomes prohibitive. In large arrays it is difficult to produce a high density of high quality vias having different sizes and shapes in close proximity to each other by the drill & fill methodology. Furthermore, laser drilled vias have rough side walls and taper inwards through the thickness of the dielectric material. This tapering reduces the effective diameter of the via. It may also adversely affect the electrical contact to the previous conductive metal layer especially at ultra small via diameters, thereby causing reliability issues. Additionally, the side walls are particularly rough where the dielectric being drilled is a composite material comprising glass or ceramic fibers in a polymer matrix, and this roughness may result in stray inductances.

The filling process of the drilled via holes is usually achieved by copper electroplating. Electroplating into a drilled hole may result in dimpling, where a small crater appears at the end of the via. Alternatively, overfill may result, where a via channel is filled with more copper than it can hold, and a domed upper surface that protrudes over the surrounding material is created. Both dimpling and overfill tend to create difficulties when subsequently stacking vias one on end of the other, as required when fabricating high-density substrates and interposers. Furthermore, it will be appreciated that large via channels are difficult to fill uniformly, especially when they are in proximity to smaller vias within the same interconnecting layer of the interposer or IC substrate design.

The range of acceptable sizes and reliability is improving over time. Nevertheless, the disadvantages described hereinabove are intrinsic to the drill & fill technology and are expected to limit the range of possible via sizes. It will further be noted that laser drilling is best for creating round via channels. Although slot shaped via channels may theoretically be fabricated by laser milling, in practice, the range of geometries that may be fabricated is somewhat limited and vias in a given support structure are typically cylindrical and substantially identical.

Fabrication of vias by drill & fill is expensive and it is difficult to evenly and consistently fill the via channels created thereby with copper using the relatively, cost-effective electroplating process.

Laser drilled vias in composite dielectric materials are practically limited to a minimum diameter of $60 \times 10^{-6}$ m, and even so suffer from significant tapering shape as well as rough side walls due to the nature of the composite material drilled, in consequence of the ablation process involved.

In addition to the other limitations of laser drilling as described hereinabove, there is a further limitation of the drill & fill technology in that it is difficult to create different diameter vias in the same layer, since when drill different sized via channels are drilled and then filled with metal to fabricate different sized vias, the via channels fill up at different rates. Consequently, the typical problems of dimpling or overfill that characterize drill & fill technology are exasperated, since it is impossible to simultaneously optimize deposition techniques for different sized vias.

An alternative solution that overcomes many of the disadvantages of the drill & fill approach, is to fabricate vias by depositing copper or other metal into a pattern created in a photo-resist, using a technology otherwise known as 'pattern plating'.

In pattern plating, a seed layer is first deposited. Then a layer of photo-resist is deposited thereover and subsequently exposed to create a pattern, and selectively removed to make trenches that expose the seed layer. Via posts are created by depositing Copper into the photo-resist trenches. The remaining photo-resist is then removed, the seed layer is etched away, and a dielectric material that is typically a polymer impregnated glass fiber mat, is laminated thereover and therearound to encase the via posts. Various techniques and processes can then be used to planarize the dielectric material, removing part of it to expose the ends of the via posts to allow conductive connection to ground thereby, for building up the next metal layer thereupon. Subsequent layers of metal conductors and via posts may be deposited there onto by repeating the process to build up a desired multilayer structure.

In an alternative but closely linked technology, known hereinafter as 'panel plating', a continuous layer of metal or alloy is deposited onto a substrate. A layer of photo-resist is deposited over an end of the substrate, and a pattern is developed therein. The pattern of developed photo-resist is stripped away, selectively exposing the metal thereunder, which may then be etched away. The undeveloped photo-resist protects the underlying metal from being etched away, and leaves a pattern of upstanding features and vias.

After stripping away the undeveloped photo-resist, a dielectric material, such as a polymer impregnated glass fiber mat, may be laminated around and over the upstanding copper features and/or via posts. After planarizing, subsequent layers of metal conductors and via posts may be deposited there onto by repeating the process to build up a desired multilayer structure.

The via layers created by pattern plating or panel plating methodologies described above are typically known as 'via posts' and feature layers from copper.

It will be appreciated that the general thrust of the microelectronic evolution is directed towards fabricating ever smaller, thinner, lighter and more powerful products having high reliability. The use of thick, cored interconnects, prevents ultra-thin products being attainable. To create ever higher densities of structures in the interconnect IC substrate or 'interposer', ever more layers of ever smaller connections are required.

If plated, laminated structures are deposited on a copper or other appropriate sacrificial substrate, the substrate may be etched away leaving free standing, coreless laminar structures. Further layers may be deposited on the side previously adhered to the sacrificial substrate, thereby enabling a two sided build up, which minimizes warping and aids the attaining of planarity.

One flexible technology for fabricating high density interconnects is to build up pattern plated or panel plated multilayer structures consisting of metal vias or via post features having various geometrical shapes and forms in a dielectric matrix. The metal may be copper and the dielectric may be a film polymer or a fiber reinforced polymer. Typically a polymer with a high glass transition temperature (Tg) is used, such as polyimide or epoxy, for example. These interconnects may be cored or coreless, and may include cavities for stacking components. They may have odd or even numbers of layers and the vias may have non circular shapes. Enabling technology is described in previous patents issued to Amitec-Advanced Multilayer Interconnect Technologies Ltd.

For example, U.S. Pat. No. 7,682,972 to Hurwitz et al. titled "Advanced multilayer coreless support structures and method for their fabrication" describes a method of fabricating a free standing membrane including a via array in a dielectric, for use as a precursor in the construction of superior electronic support structures. The method includes the steps of fabricating a membrane of conductive vias in a dielectric surround on a sacrificial carrier, and detaching the membrane from the sacrificial carrier to form a free standing laminated array. An electronic substrate based on such a free standing membrane may be formed by thinning and planarizing the laminated array, followed by terminating the vias. This publication is incorporated herein by reference in its entirety.

U.S. Pat. No. 7,669,320 to Hurwitz et al. titled "Coreless cavity substrates for chip packaging and their fabrication" describes a method for fabricating an IC support for supporting a first IC die connected in series with a second IC die; the IC support comprising a stack of alternating layers of copper features and vias in insulating surround, the first IC die being bondable onto the IC support, and the second IC die being bondable within a cavity inside the IC support, wherein the cavity is formed by etching away a copper base and selectively etching away built up copper. This publication is incorporated herein by reference in its entirety.

U.S. Pat. No. 7,635,641 to Hurwitz et al. titled "Integrated circuit support structures and their fabrication" describes a method of fabricating an electronic substrate comprising the steps of; (A) selecting a first base layer; (B) depositing a first etchant resistant barrier layer onto the first base layer; (C) building up a first half stack of alternating conductive layers and insulating layers, the conductive layers being interconnected by vias through the insulating layers; (D) applying a second base layer onto the first half stack; (E) applying a protective coating of photo-resist to the second base layer; (F) etching away the first base layer; (G) removing the protective coating of photo-resist; (H) removing the first etchant resistant barrier layer; (I) building up a second half stack of alternating conductive layers and insulating layers, the conductive layers being interconnected by vias through the insulating layers, wherein the second half stack has a substantially symmetrical lay up to the first half stack; (J) applying an insulating layer onto the second half stack of alternating conductive layers and insulating layers, (K) removing the second base layer, and (L) terminating the substrate by exposing ends of vias on outer surfaces of the stack and applying terminations thereto. This publication is incorporated herein by reference in its entirety.

The via post technology described in U.S. Pat. No. 7,682,972, U.S. Pat. No. 7,669,320 and U.S. Pat. No. 7,635,641 lends itself to mass production, with very large numbers of vias being simultaneously electroplated. As mentioned above, current drill & fill vias have an effective minimal diameter of about 60 microns. In contradistinction, via post technology using photo resist and electroplating, enables much higher densities of vias to be obtained. Via diameters of as little as 30 micron diameter are possible and various via geometries and shapes could be cofabricated within the same layer.

Over time, it is anticipated that both drill & fill technologies and via post deposition will enable fabrication of substrates with further miniaturization and higher densities of vias and features. Nevertheless, it would appear likely that developments in via post technology will maintain a competitive edge.

Substrates enable chips to interface with other components. Chips have to be bonded to substrates through assembly processes that provide reliable electronic connections to enable electronic communication between chips and substrates.

Embedding chips within the interposers to the outside world enables shrinking the chip package, shortening the connections to the outside world, offers cost savings by simpler manufacturing that eliminates die to substrate assembly processes and potentially has increased reliability.

Essentially, the concept of embedding active components such as analog, digital and MEMS chips involves the construction of chip support structures or substrates, having vias around the chip.

One way of achieving embedded chips is to fabricate chip support structures onto the chip array on the wafer where the circuitry of the support structure is larger than the die unit size. This is known as Fan Out Wafer Layer Packaging (FOWLP). Although the size of silicon wafers is growing, expensive material sets and manufacturing process are still limiting the diameter size to 12", thereby limiting the number of FOWLP units one can place on the wafer. Despite the fact that 18" wafers are under consideration, the investment required, materials sets and equipment are still unknown. The limited number of chip support structures that may be processed at one time increases the unit cost of FOWLP, and make it too expensive for markets requiring highly competitive pricing, such as wireless communication, home appliances and automotive markets.

FOWLP also represents a performance limitation since the metal features placed over the silicon wafer as fan-out or fan-in circuitry are limited in thickness to a few microns. This creates electrical resistance challenges.

An alternative fabrication route involves sectioning the wafer to separate the chips and embedding the chips within a panel consisting of dielectric layers with copper interconnects. One advantage of this alternative route is that the panels may be very much larger with very many more chips embedded in a single process. For example, whereas for example, a 12" wafer enables 2,500 FOWLP chips having dimensions of 5 mm×5 mm to be processed in one go, current panels used the applicant, Zhuhai Access, are 25"×

21", enabling 10,000 chips to be processed in one go. Since the price of processing such panels is significantly cheaper than on wafer processing, and since to throughput per panel is 4× higher than throughput on wafer, the unit cost can drop significantly, thereby opening new markets.

In both technologies, the line spacing and the width of the tracks used in industry are shrinking over time, with 15 micron going down to 10 microns being standard on panels and 5 microns going down to 2 microns on wafers.

The advantages of embedding are many. First level assembly costs, such as wire bonding, flip chip or SMD (Surface Mount Devices) soldering, are eliminated. The electrical performance is improved since the die and substrate are seamlessly connected within a single product. The packaged dies are thinner, giving an improved form factor, and the upper surface of the embedded die package is freed up for other uses including stacked die and PoP (Package on Package) technologies.

In both FOWLP and Panel based embedded die technologies, the chips are packaged as an array (on wafer or panel), and, once fabricated, are separated by dicing.

Embodiments of the present invention address fabricating embedded chip packages.

Embodiments of the present invention address polymer frames with sockets for chips, for packaging chips.

BRIEF SUMMARY

A first aspect is directed to a method for creating an array of cavities in a plate of dielectric material comprising pressing sheets of the dielectric material over a sacrificial array of metal stubs under heat and pressure and then etching away the metal stubs.

Typically the dielectric material comprises a polymer matrix.

Optionally the dielectric material further comprises glass fibers.

Optionally the dielectric material comprises a pre-preg of woven glass fiber bundles impregnated with the polymer matrix.

Optionally the metal stubs comprise copper.

In one variant method, the metal stubs are fabricated by:
(i) obtaining a continuous copper layer on a substrate covered with a layer of barrier metal;
(ii) applying a layer of photoresist;
(iii) patterning the layer of photoresist, and
(iv) etching away the copper, using the patterned layer of photoresist as a stencil.

In another variant method, the metal stubs are fabricated by:
(a) applying a layer of photoresist over a barrier metal substrate;
(b) patterning the layer of photoresist;
(c) electroplating copper into the patterned photoresist;
(d) removing the photoresist.

Typically, the cavities are characterized by substantially parallel edges that meet at corners having a radius of curvature of etching away the copper, using the patterned layer of photoresist as a stencil.

Typically, the corners of the cavities have a radius of curvature of less than 100 microns.

Optionally, the corners of the cavities have a radius of curvature of less than 50 microns.

Optionally, the dimensions of said cavities are fabricable within a tolerance of +−25 microns.

Optionally copper vias are cofabricated with the copper stubs and are embedded within the plate.

Typically the array is a rectangular array comprising cavities arranged in rows and columns.

Optionally, the array comprises at least 1 cavity.

Optionally, elongated sacrificial copper sectioning elements are cofabricated with the vias and stubs and embedded within the polymer matrix, such that etching of the copper sectioning elements assists singulation of the framework.

Optionally the elongated sacrificial copper sectioning elements cross each other to form a framework.

A second embodiment is directed to providing a framework defining an array of rectangular cavities, each of said cavities for receiving a rectangular chip, said framework comprising a dielectric material having a polymer matrix.

Typically, the array is a rectangular array comprising rows and columns.

Typically, said cavities are substantially rectangular and are fabricated to within tolerances of +−25 microns.

Typically, the corners of the rectangular cavities have a radius of curvature of less than 100 microns.

Optionally, the corners of the rectangular cavities have a radius of curvature of less than 50 microns.

Typically, the polymer matrix comprises polyimide, epoxy or BT (Bismaleimide/Triazine) or their blends.

Optionally, the dielectric material further comprises ceramic fillers.

Typically, the cavities may have dimensions in the range of from about 0.9 mm×0.9 mm, up to about 31×31 mm.

Typically the frame has a depth in the range of 50 microns to 100 microns.

Optionally, the dielectric material further comprises glass fibers.

Optionally, the dielectric material further comprises copper via posts within the polymer matrix.

Optionally, the dielectric material further comprises elongated sacrificial copper sectioning elements within the polymer matrix that are etchable to assist singulation of the framework.

Optionally the elongated sacrificial copper sectioning elements cross each other to form a framework.

A thirds aspect is directed to a chip embedded in a dielectric frame comprising a polymer resin and reinforcing fibers, wherein the dielectric frame is characterized by adjacent smooth walls without protruding fibers, that meet at a vertex characterized by a radius of curvature of less than 100 microns, the space between the chip and the surrouding frame being filled with a filler material.

Typically, the filler material is applied as a molding compound, a film or a pre-preg.

BRIEF DESCRIPTION OF THE DRAWINGS

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In the accompanying drawings.

DETAILED DESCRIPTION

In the description herein below, support structures consisting of metal vias in a dielectric matrix, particularly, copper via posts in a polymer matrix, such as polyimide, epoxy or BT (Bismaleimide/Triazine) or their blends, reinforced with glass fibers are considered.

It is a feature of Access' photo-resist and pattern or panel plating and laminating technology, as described in U.S. Pat. No. 7,682,972, U.S. Pat. No. 7,669,320 and U.S. Pat. No. 7,635,641 to Hurwitz et al., incorporated herein by reference, that large panels comprising very large arrays of substrates with very many via posts may be fabricated. Such panels are substantially flat and substantially smooth.

It is a further feature of Access' technology that vias fabricated by electroplating using photoresist, may be narrower than vias created by drill & fill. At present, the narrowest drill & fill vias are about 60 microns. By electroplating using photoresist, a resolution of under 50 microns, or even as little as 25 microns is achievable. Coupling ICs to such substrates is challenging. One approach for flip chip coupling is to provide copper pads that are flush with the surface of the dielectric. Such an approach is described in U.S. Ser. No. 13/912,652 to the present inventors.

All methods for attaching chips to interposers are costly. Wire bonding and flip chip technologies are costly and broken connections result in failure.

Chip size reliable packages are desirable. It is also desirable to eliminate wire bonding.

One way of achieving this is by fabricating a polymer framework with a rectangular array of cavities (sockets) into which the chips may be placed. The chips may be embedded into the cavities by applying a polymer thereover or therearound Fan-out terminations may be applied on one side of the embedded chips and surrounding frame, or, if the frame includes embedded vias, terminations may be applied on both sides of the frame. The array may then be diced into separate chip packages.

Figure 1:
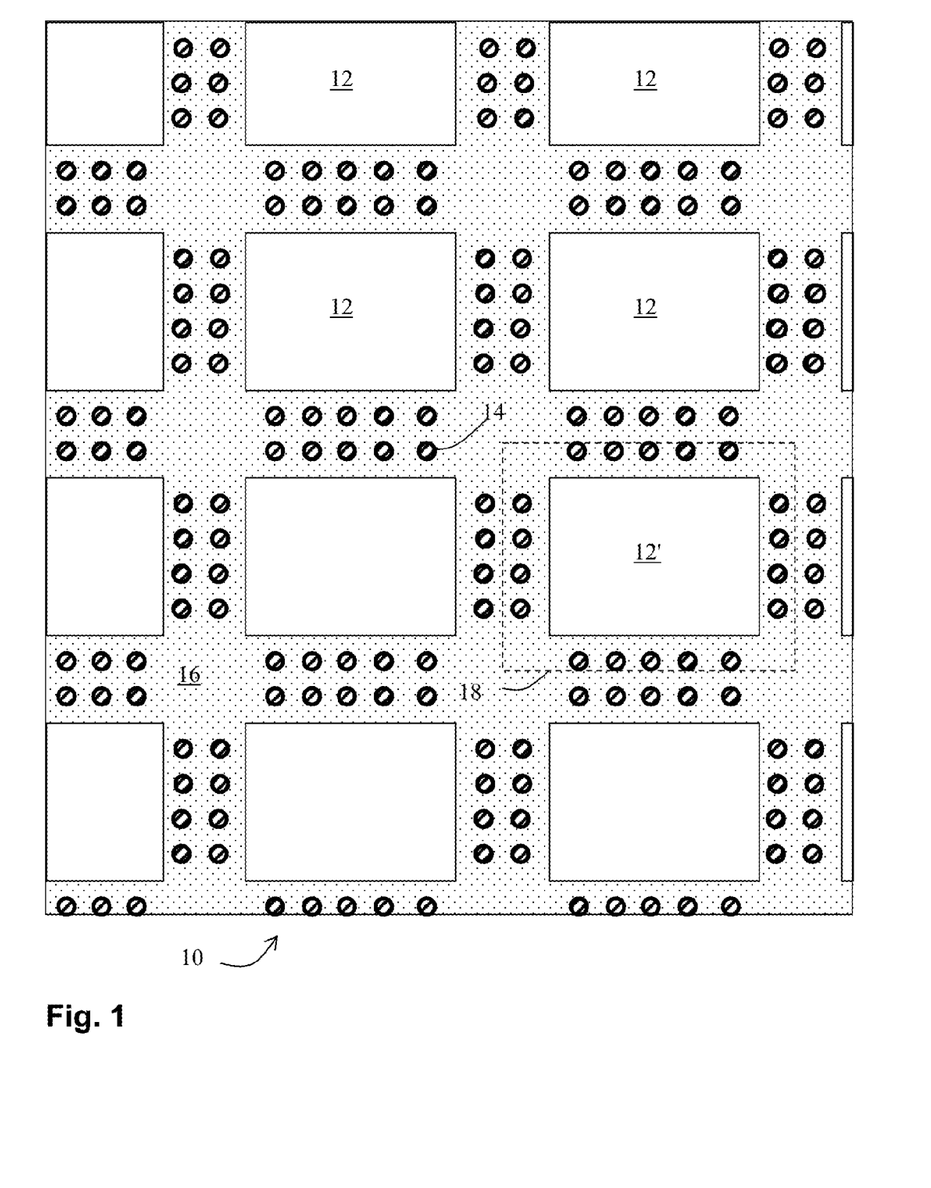
FIG. 1 is schematic illustration of a part of a polymer or composite grid having sockets therein for chips, and also having the optional but desirable feature of through vias around the sockets.

With reference to FIG. 1, there is shown part of an array 10 of chip sockets 12 defined by a dielectric framework 16 comprising a polymer matrix 14, such that each chip socket 12 is surrounded by a frame 18. Optionally, as shown, the frame includes one or more metal vias 14 through the polymer matrix framework 16.

The array 10 may be part of a panel comprising an array of chip sockets 12, each surrounded and defined by a polymer matrix frame 18. In some embodiments, a grid of copper vias 14 is provided through the dielectric frame 18 with the polymer matrix.

Each chip socket 12 is thus surrounded by a frame 18 of polymer matrix and may have a number of copper through vias through the frame 18, arranged around the socket 12'.

The frame 18 may be a polymer applied as a polymer sheet, or may be a weave of glass fiber bundles impregnated with the polymer and applied as a pre-preg. The polymer matrix may also include ceramic particles that serve as fillers. More details may be found below with reference to FIG. 8, methods of manufacture are discussed.

Figure 2:
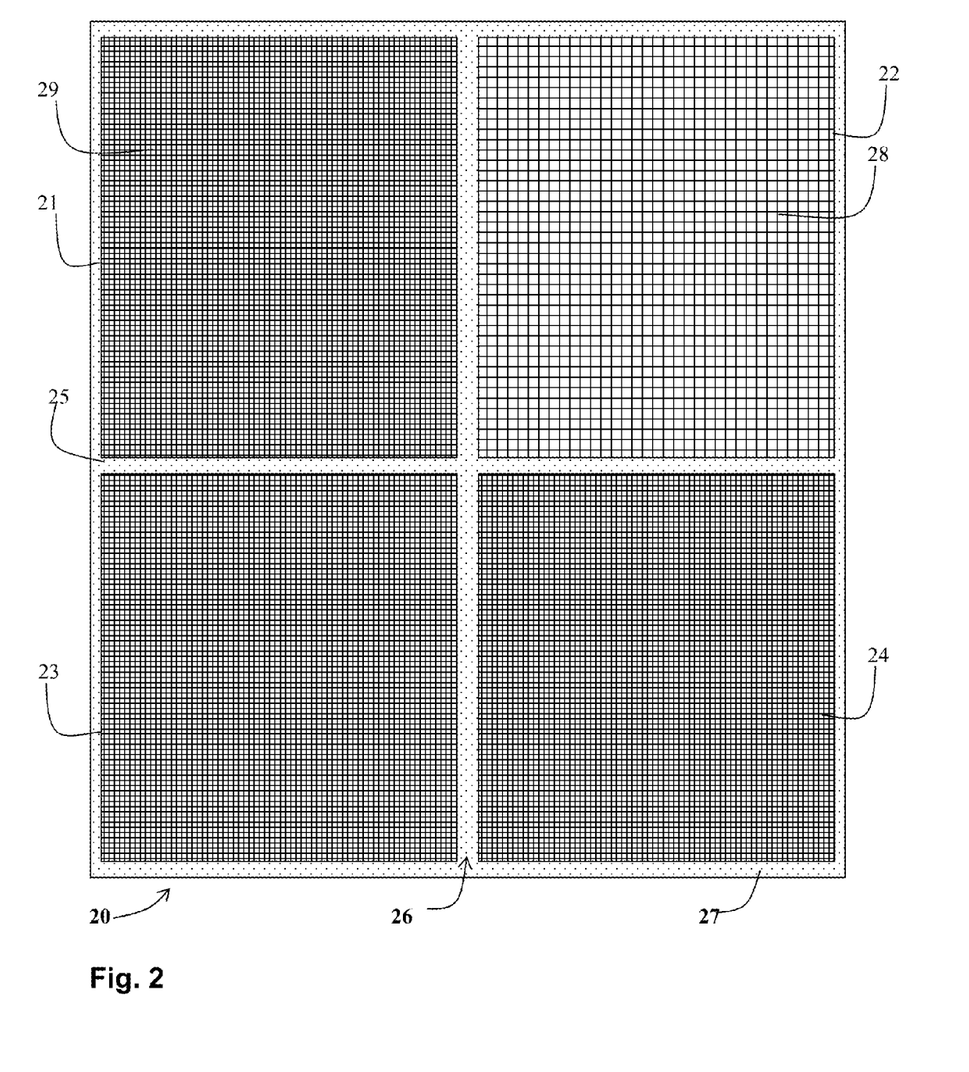
FIG. 2 is a schematic illustration of a panel having areas or panes that are frameworks around cavities or sockets that may be used for fabricating embedded chips. Optionally, one or more such reasons is characterized by the frames having through vias surrounding the sockets. The figure shows how part of the panel, such as one pane may have sockets for a different type of chip.

With reference to FIG. 2, panels 20 fabricated by the applicant, Zhuhai Access, are typically divided into a 2×2 array of blocks 21, 22, 23, 24 separated from each other by a main frame consisting of a horizontal bar 25 a vertical bar 26 and an external frame 27. The blocks may comprise arrays of chip sockets 12 FIG. 1 that may or may not include vias through the frames surrounding the chip sockets. Assuming a 5 mm×5 mm chip socket and Access' 21"×25" panels, this manufacturing technique enables 10,000 chips to be packaged on each panel. In contradistinction, fabricating chip packages on a 12" wafer, which is currently the largest wafer used in industry, enables only 2,500 chips to be processed in one go, so the economies of scale in fabricating on large panels will be appreciated.

Panels appropriate for this technology, may, however, vary in size somewhat. Typically, panels would be between about 12"×12" and about 24"×30". Some standard sizes in current use are 20"×16", 20.3"×16.5" and 24.7"×20.5".

Not all the blocks of the panel 20 need to have chip sockets 12 of the same size, and different sized sockets may be fabricated at the same time. For example, in the schematic illustration of FIG. 2, the chip sockets 28 of the top right block 22 are larger than the chip sockets 29 of the other blocks 21, 23, 24. Furthermore, not only may one or more blocks 22 be used for a different sized socket for receiving a different sized chip, but any sub array of any size may be used to fabricate any specific die package, so despite the large throughputs, small runs of small numbers of die packages may be fabricated, enabling different die packages to be simultaneously processed for a specific customer, or different packages to be fabricated for different customers. Thus a panel 20 may comprise at least one region 22 having sockets 28 with a first set of dimensions for receiving one type of chip, and a second region 21 having sockets 29 with a second set of dimensions for receiving a second type of chip.

As described hereinabove with reference to FIG. 1, each chip socket 12 (28, 29 FIG. 2) is surrounded by a polymer frame 18 and in each block (21, 22, 23, 24—FIG. 2), an array of sockets 28 (29) are positioned.

Figure 3:
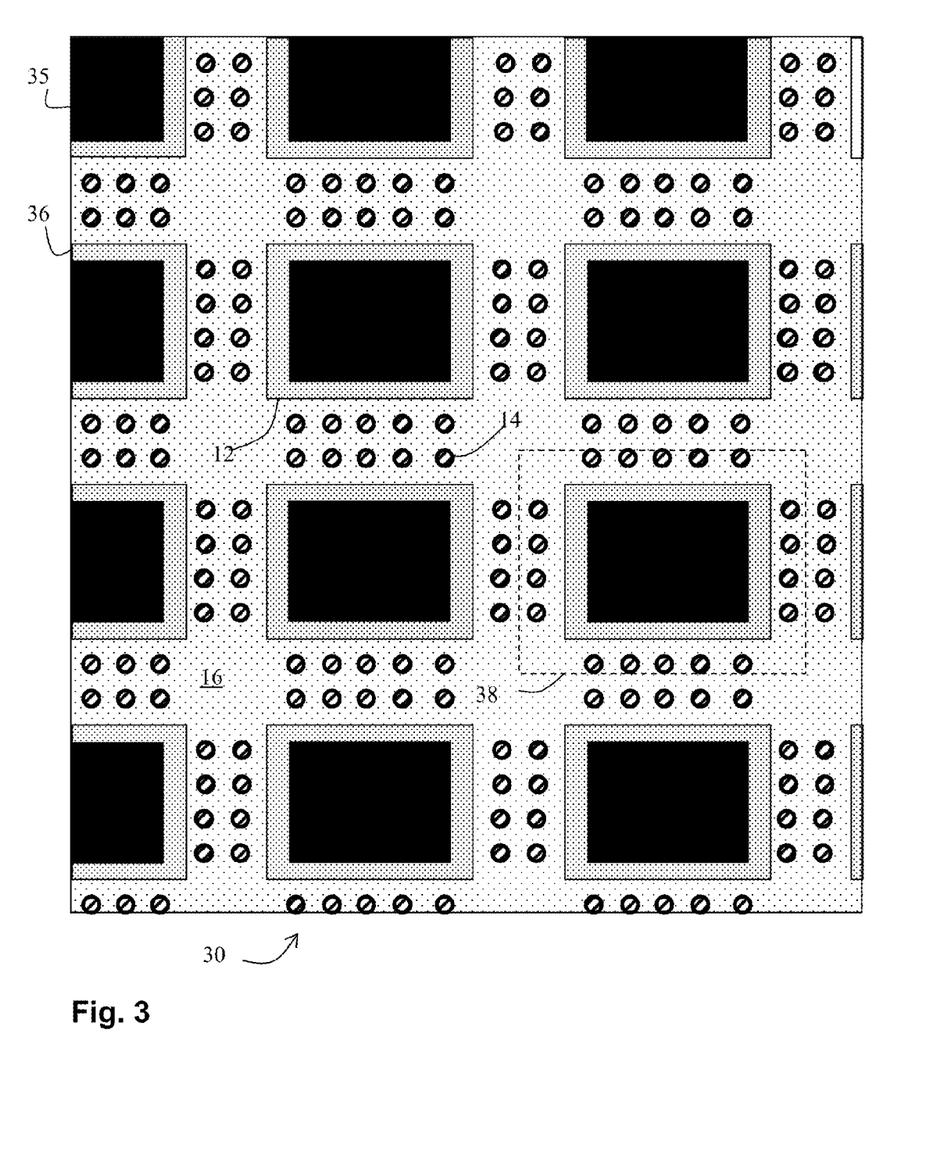
FIG. 3 is schematic illustration of the part of the polymer or composite framework of FIG. 1, with chips within each socket, held in place by a polymer or composite material, such as a molding compound, for example. It will be noted that the sockets are characterized by smooth walls that meet at corners having tight radii of curvature, typically less than 100 microns.

With reference to FIG. 3, a chip 35 may be positioned in each socket 12, and the space around the chip 35 may be filled in with a polymer 36 which may or may not be the same polymer as that used for fabricating the frame 16. It may be a molding compound for example. In some embodiments, the matrix of the filler polymer 36 and that of the frame 16 may use similar polymers, but with different reinforcing fibers. For example, the frame may include reinforcing fibers, whereas the polymer 36 used for filling in the socket may be fiber free.

The polymer frame 18 and the polymer filler 36 have similar coefficients of thermal expansion in the Z (through thickness) direction, and may comprise very similar, or, indeed, the same polymer.

Typical die sizes may be anything from about 0.9 mm×0.9 mm, up to about 31×31 mm, with the sockets slightly larger to accommodate the intended dies with clearance. The thickness of the interposer frame must be at least the depth of the die, and is preferably 10 microns to 100 microns. Typically, the depth of the frame is the thickness of the die+a further 20 microns. By virtue of Zhuhai-Access' construction methods for constructing the sockets by lamination over sacrificial copper stubs which are subsequently dissolved, the walls of the sockets are much smoother than those attainable by mechanical tooling or by laser drilling which result in rough walls and, where the frame material is fiber reinforced, may result in fibers protruding into the socket. Additionally, the radius of curvature of the corners of the cavity or socket 12 created by etching away copper stubs may be much tighter than that attainable by laser drilling or by mechanical tooling. One result of this is that the cavity 12 may be a much tighter fit around the chip 35. Smaller chips 35 may be encapsulated in smaller chip packages. This enables ever greater miniaturization of the final product.

As a result of the embedding of chips 35 into the sockets 12, each individual chip is surrounded by a frame 38 that may have vias 14 therethrough, arranged around the edges of each die.

Using Access' via post technology, either by pattern plating or by panel plating followed by selective etching, the chip sockets 12 may be fabricated by creating sacrificial stubs of copper that may subsequently be laminated with polymer and typically with a polymer matrix including glass fiber reinforcements. After lamination, the copper stubs are dissolved, leaving the sockets 12. This fabrication technique is characterized by providing smooth walls where adjacent walls can meet at a tight corner with a radius of curvature of less than about 100 microns.

Punching or machining out the cavities using mechanical or laser cutting technology leaves corners that have much larger radius of curvature and may result in glass fibers protruding from the edges of the cavity or socket into the cavity. These effects cause the need for cavities to be rather larger than the chips to be inserted thereinto. Using sacrificial copper stubs enables much tighter fit between chip and socket and enables reduction in overall size of the chip package.

In addition to sacrificial stubs, vias 14 may be fabricated as via posts and subsequently laminated with a dielectric material, using polymer films, or, for added stability, pre-pregs consisting of woven glass fiber bundles in a polymer matrix to embed the via posts into the framework. In one embodiment, the dielectric material is Hitachi 705G. In another embodiment, Sumitomo LAZ-7751 series films are used. Ajomoto film such as T31 is another candidate. Alternative materials include Taiyo HBI, also known as Zaristo-125.

Alternatively, vias may be fabricated into preformed frameworks using what is generally known as drill-fill technology. First a polymer or fiber reinforced polymer matrix is fabricated and then, after curing, it is drilled with holes, either by mechanical or by laser drilling. The drilled holes may then be filled with copper by electroplating.

There are many advantages in fabricating the vias using via post rather than the drill-fill technology. In via post technology, since all vias may be fabricated simultaneously, whereas holes are drilled individually, the via post technology is faster. Furthermore, since drilled vias are cylindrical whereas via posts may have any shape. In practice all drill-fill vias have the same diameter (within tolerances), whereas via posts may have different shapes and sizes. Also, for enhanced stiffness, preferably the polymer matrix is fiber reinforced, typically with woven bundles of glass fibers. Where fiber in polymer pre-pregs are laid over upstanding via posts and cured, the posts are characterized by smooth, vertical sides. However, drill-fill vias typically taper somewhat and, where a composite is drilled, typically have rough surfaces which result in stray inductances that cause noise.

Generally, the vias 14 are in the range of 40 micron to 500 micron wide. If cylindrical, such as required for drill-fill and such as is often the case for via posts, each via may have a diameter in the range of tens of microns to 500 micron.

With further reference to FIG. 3, after fabricating the polymer matrix framework 16 with embedded vias around sacrificial copper blocks, using either panel plating or pattern plating, the copper via posts 14 are selectively shielded, using a photoresist, for example, and then the copper blocks may be etched away to create the sockets 12.

It will be noted that unlike creating the sockets or cavities by laser milling, plating copper stubs, laminating the framework therearound and then etching away the stubs enables fabricating of such sockets or cavities with smooth side walls without protruding glass fibers. The radius of curvature that is attainable at the corners of cavities and sockets created by fabricating rectangular copper stubs, laminating and then dissolving the copper is very good, with a radius of curvature of +−25 microns being attainable. This is much better than that obtainable by mechanical or laser milling and enables close fitting sockets to be used with chips, for high miniaturization as desired by industry.

A polymer framework of a socket array 38 with a frame 38 around each socket 12 may be used for creating individual and multiple chip packages, including multiple chip packages and built up multilayer chip packages, such as Package-on-Package "PoP" arrays. Optionally, but not necessarily, one or more such chip packages will have conductive vias 14 in the frame 38 around each socket 12. Notably, the sockets 38 are characterized by having smooth walls, even when the surrounding frame is reinforced with glass fibers. These walls are mutually perpendicular and adjacent walls meet at a tight corner, having a radius of curvature of less than 100 microns, with a radius of curvature of 25 microns being attainable.

The chips may be picked up by robot and positioned in the sockets. Once the chips 35 are positioned in the sockets 12, they may be fixed in place using a polymer 36, such as a molding compound, a film or a pre-preg.

Figure 4:
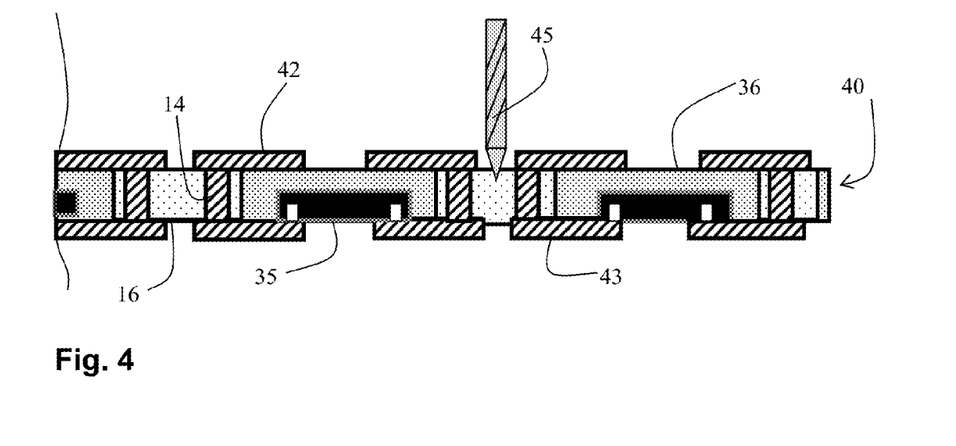
FIG. 4 is a schematic illustration of a cross-section through part of the framework showing embedded chips held within each socket by a polymer material, and also showing through vias and pads on both sides of the panel.

With reference to FIG. 4, copper routing layers 42, 43 may be fabricated on one or both sides of the framework 40 embedded with chips 35. Typically, the chips 35 are flip chips and are coupled to pads 43 that fan out beyond the edges of the chip 35. Where the frame includes through vias 14, by virtue of these through vias 14, pads 42 on the upper surface allow coupling a further layer of chips for PoP packaging and the like. Essentially, it will be appreciated that the upper and lower pads 42, 43 enable building up further via posts and routing layers to create more complex structures.

Figure 5:
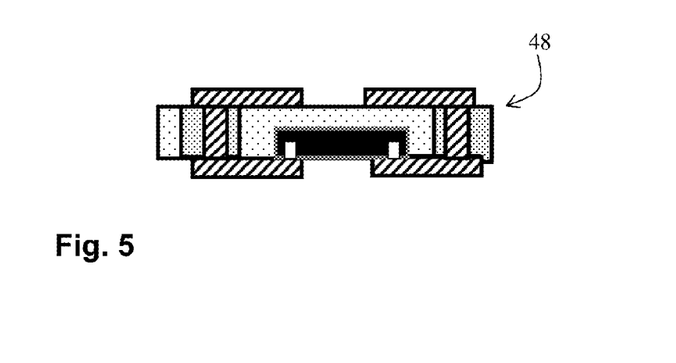
FIG. 5 is a schematic illustration of a cross-section through a die containing an embedded chip.

A dicing tool 45 is shown. It will be appreciated that the array of packaged chips 35 in the panel 40 by be easily diced into individual chips 48 as shown in FIG. 5.

Figure 6:
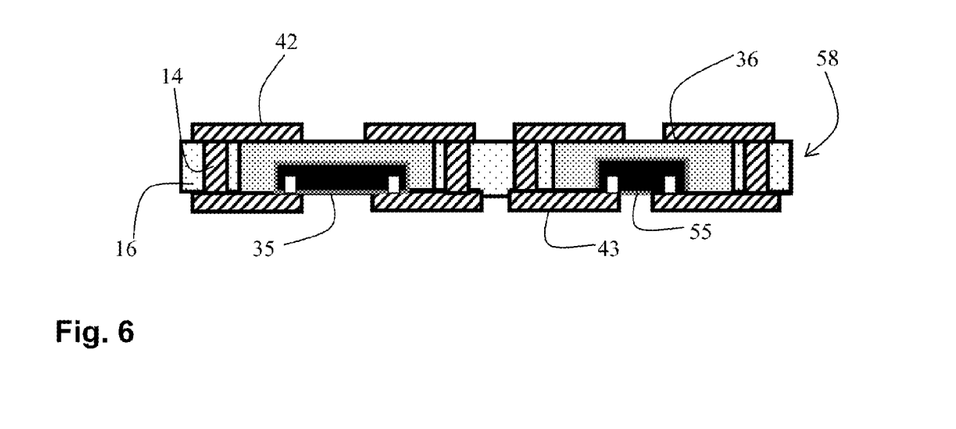
FIG. 6 is a is a schematic illustration of a cross-section through a package containing a pair of dissimilar dies in adjacent sockets.

Referring to FIG. 6, in some embodiments, adjacent chip sockets may have different dimensions, including different sizes and/or different shapes. For example, a processor chip 35 may be positioned in one socket and coupled to a memory chip 55 positioned in an adjacent socket. Thus a package may include more than one chip, and may include different chips.

The pads 42, 43 may couple to chips via ball grid arrays BGA or land grid arrays LGA. At the current state of the art, via posts may be about 130 microns long. Where the chips 35, 55 are thicker than about 130 microns, it may be necessary to stack one via on top of another. The technology for stacking vias is known, and is discussed, inter alia, in co-pending applications U.S. Ser. No. 13/482,099 and U.S. Ser. No. 13/483,185 to Hurwitz et al.

Figure 7:
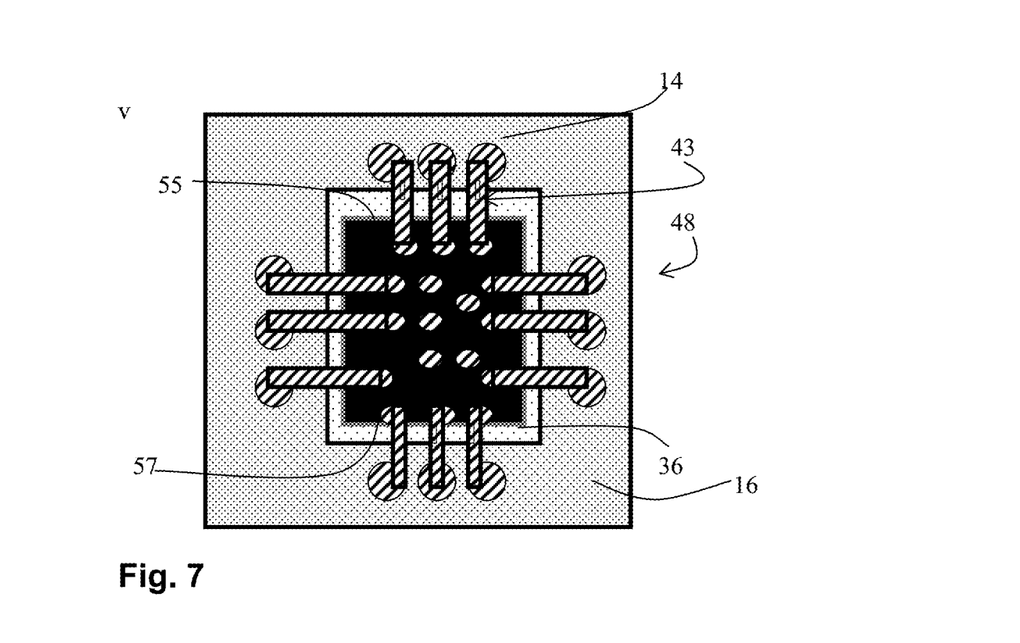
FIG. 7 is a schematic bottom view of a package such as that shown in FIG. 5.

With reference to FIG. 7, a die package 48 comprising a die 55 in a polymer frame 16 is shown from below, such that the die 55 is surrounded by the frame 16 and through vias 14 are provided through the frame 16 around the perimeter of the die 55. The die is positioned in a socket and held in place by a second polymer 36. The frame 16 is typically fabricated from a fiber reinforced pre-preg for stability. The second polymer 36 may also be a pre-preg but may be a polymer film or a molding compound. Typically, as shown the through vias 14 are simple cylindrical vias, but they may have different shapes and sizes. Some of the ball grid array of solder balls 57 on the chip 55 are connected to the through vias 14 by pads 43 in a fan out configuration. As shown, there may be additional solder balls that are coupled directly to a substrate beneath the chip. In some embodiments, for communication and data processing, at least one of the through vias is a coaxial via. In other embodiments, at least one via is a transmission line. Technologies for manufacturing coaxial vias are given in co-pending application U.S. Ser. No. 13/483,185, for example. Technologies for fabricating transmission lines are provided in U.S. Ser. No. 13/483,234 for example.

By virtue of the sockets being fabricated by laminating over sacrificial copper stubs that are subsequently etched away, the edges of the sockets are smooth, even where the frame contains reinforcing glass fibers. The corners have a tight radius of curvature that is typically less than 100 microns and may be, say. Of the order of 25 microns. This enables minimal clearance between the chip and frame, and, by virtue of the organic fiber stiffeners, the frame around each chip may be relatively narrow.

In addition to providing contacts for chip stacking, through vias 14 surrounding a chip may be used to isolate the chip from its surroundings and to provide Faraday shielding. Such shielding vias may be coupled to pads that interconnect the shielding vias over the chip and provide shielding thereto.

There may be more than one row of through vias surrounding the chip, and the inner row could be used for signaling and the outer row for shielding. The outer row could be coupled to a solid copper block fabricated over the chip that could thereby serve as a heat sink to dissipate heat generated by the chip. Different dies may be packaged in this manner.

The embedded chip technology with a frame having through vias described herein is particularly suited for analog processing, since the contacts are short, and there are a relatively small number of contacts per chip.

It will be appreciated that the technology is not limited to packaging IC chips. In some embodiments, the die comprises a component selected from the group consisting of fuses, capacitors, inductors and filters. Technologies for manufacturing inductors and filters are described in co-pending application number U.S. Ser. No. 13/962,316 to Hurwitz et al.

Figure 8:
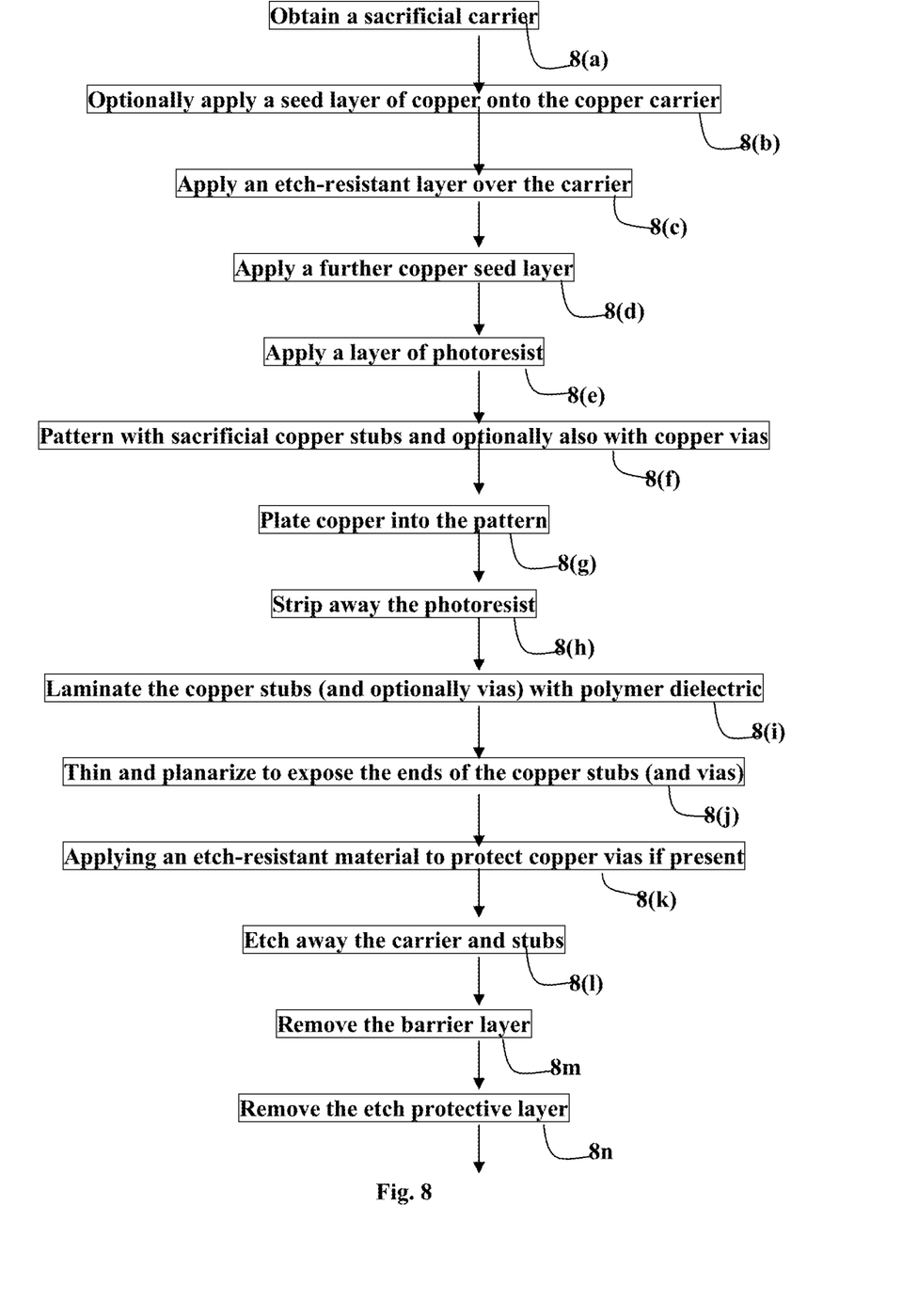
FIG. 8 is a flowchart showing a manufacturing process for fabricating a polymer or composite panel including an array of through vias.
Figure 8A:
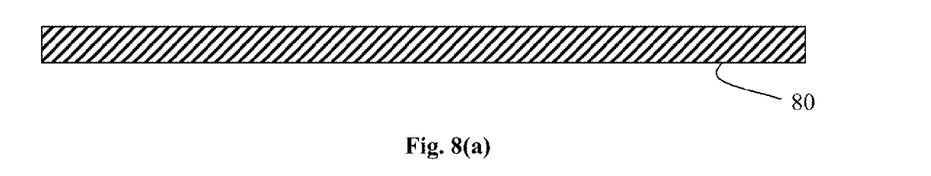
FIGS. 8(a) to 8(n) are schematic illustrations of the intermediate substructures obtained after each step of the flowchart 8.
Figure 8B:
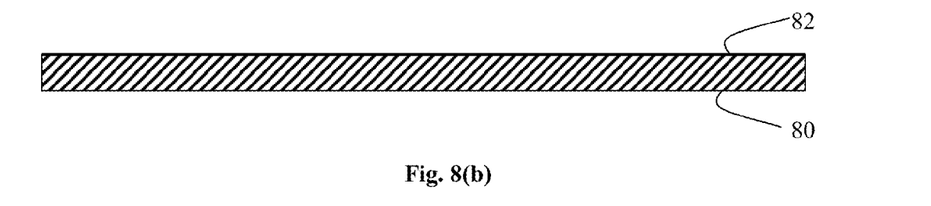
Figure 8C:
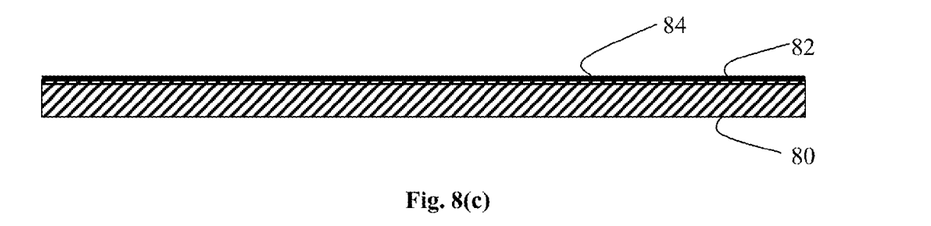
Figure 8D:
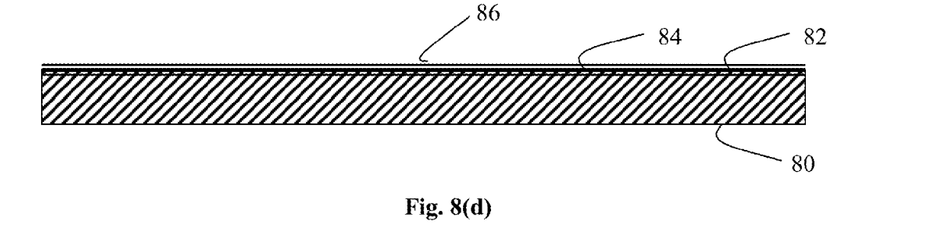
Figure 8E:
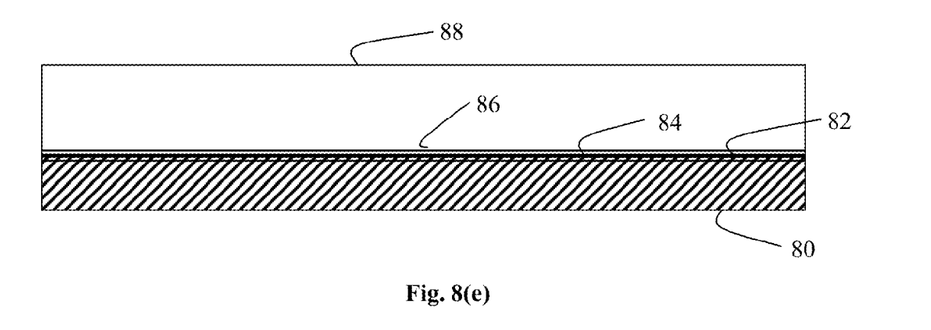
Figure 8F:
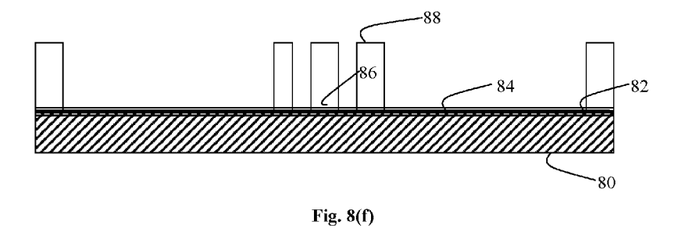
Figure 8G:
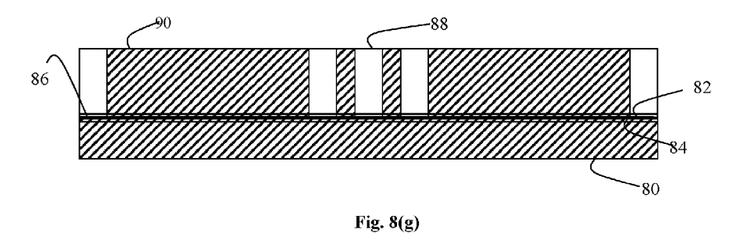
Figure 8H:
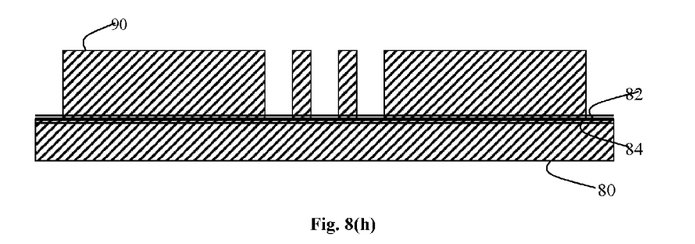
Figure 8I:
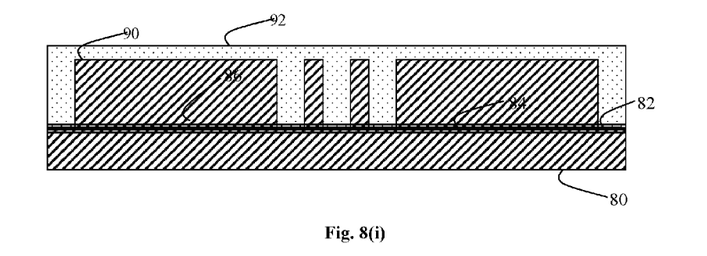
Figure 8J:
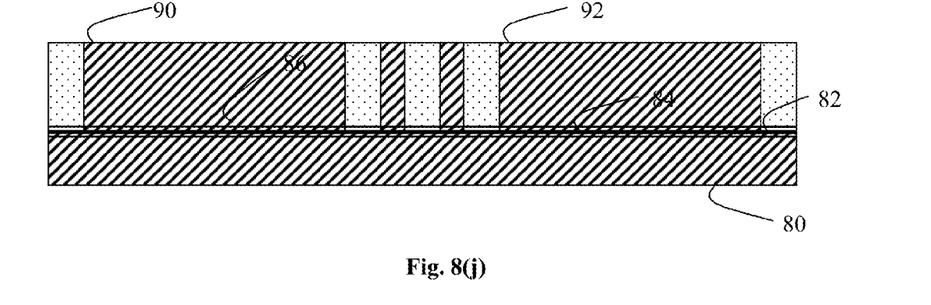
Figure 8K:
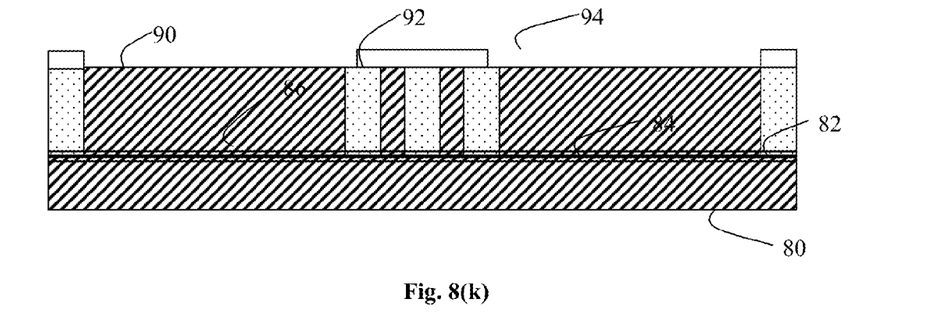
Figure 8L:
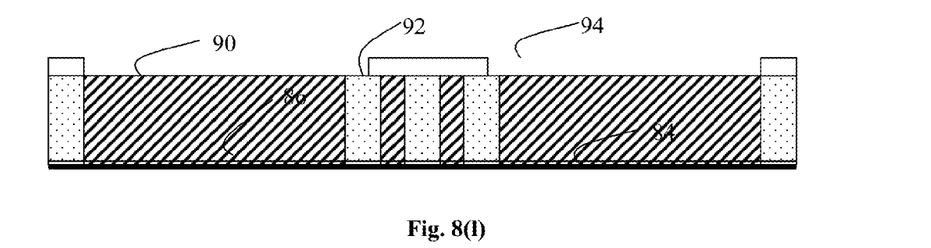
Figure 8M:
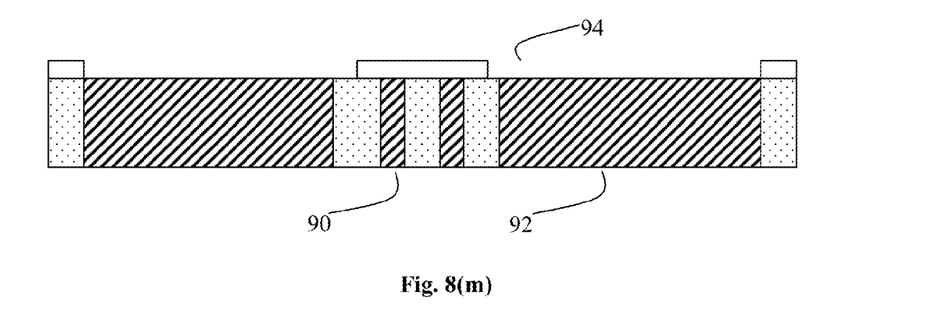
Figure 8N:
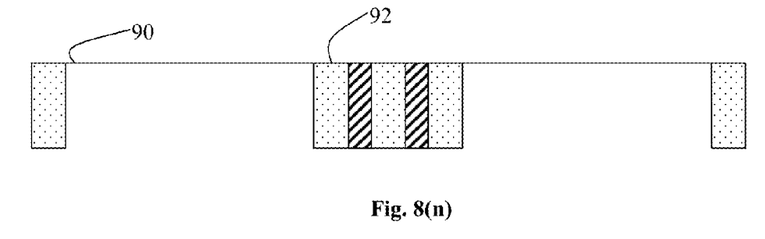

With reference to FIG. 8 and to FIGS. 8(a) to 8(n), a method of fabricating an array of chip sockets surrounded by an organic matrix framework comprises the steps of: obtaining a sacrificial carrier 80-8(a).

Optionally a seed layer of copper 82 is applied onto the copper carrier—8(b). An etch-resistant layer 84 is applied over the carrier—8(c), typically consisting of nickel and is typically deposited by a physical vapor process such as sputtering. It may alternatively be deposited by electroplating or electroless plating, for example. Other candidate materials include tantalum, tungsten, titanium, titanium-tungsten alloy, tin, lead, tin-lead alloy, all of which may be sputtered, and tin and lead may also be electroplated or electroless plated, the barrier metal layer is typically 0.1 to 10 microns thick. (Each candidate barrier layer material is later removed with appropriate solvent or plasma etching conditions). After application of the barrier layer, a further copper seed layer 86 is applied—8(d). The copper seed layer is typically about 0.2 microns to 5 microns thick.

Steps 8(b) to 8(d) are preferable to ensure good adhesion of the barrier layer to the substrate, good adhesion and growth of sacrificial copper stubs and vias, and to enable subsequent removal of the substrate by etching without damaging vias. Although best results include these steps, they are, however, optional, and one or more may not be used.

A layer of photoresist 88 is now applied—step (e), FIG. 8(e) and patterned with a pattern of sacrificial copper stubs and optionally a pattern of copper vias—8(f). Then copper 90 is plated into the pattern—8(g), and the photoresist 88 is stripped away—8(h). The upstanding copper stubs (and optionally also vias 90) are laminated with polymer dielectric 92—8(i) which may be a fiber reinforced polymer matrix pre-preg. The laminated via array is thinned and planarized to expose the ends of the copper stubs (and the vias, if provided)—8(j). The carrier is then removed.

If the planarized polymer dielectric includes copper vias, the exposed ends of the copper vias is protected by applying an etch-resistant material 94—8(k) such as a photoresist or dielectric film, prior to the carrier 80 and stubs being etched away 8(l). Typically the carrier is a copper carrier 80 that is removed by dissolving the copper. Ammonium-hydroxide or copper chloride may be used to dissolve the copper.

The barrier layers may then be etched away—8(m) using a specific etchant, depending on the barrier layer material. Where included, the bottoms of vias may be protected with dry film 94. The etch protective layer 94 may then be removed—step 8(n).

Although not described herein, it will be appreciated that the upstanding copper stubs (and vias, if provided) could be fabricated by panel plating and selectively etching away superfluous copper to leave the vias. Indeed, the sockets could alternatively be fabricated by selectively etching away parts of a copper panel whilst shielding the vias.

As described hereinabove, using via post technology, both the sacrificial stubs and the electroplated vias where provided, may have any shape or size. The sacrificial stubs and resultant sockets are typically rectangular. Vias within the frame may be simple square or circular vias, or may be elongated to provide vias that can also serve as inductors, signal carriers or Faraday shields. Furthermore, a frame can include two or more via layers separated by pads.

Figure 9:
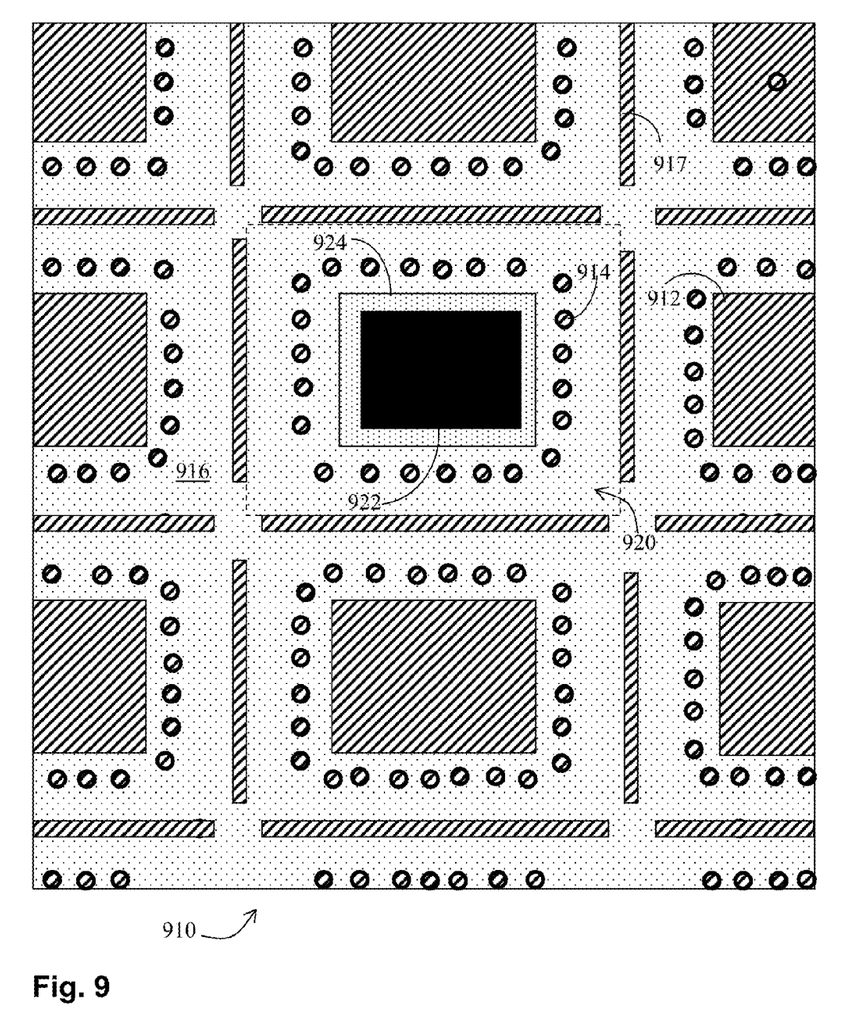
FIG. 9 is a section through a panel showing copper stubs, vias and elongated sectioning elements.

It will be noted that fabricating elements in an array on a panel or wafer enables cofabrication of a large number of components at the same time. Electro-deposition and lamination are processes that provide economies of scale. The use of a framework, as described herein, is particularly advantageous in that many components may be processed in one go and then singulated. However, the singulation processing stage is time-consuming and expensive. Both glass reinforced polymer frameworks and metal frameworks may be singulated into individual frames by mechanical tooling. This is, however, expensive in saw blades. Other possibilities are laser or water cutting. The advantages and disadvantages of these techniques in terms of time, precision and operating costs are well known. It is possible to not only fabricate sacrificial copper stubs that may be dissolved to create cavities, and copper vias that are embedded into the framework and facilitate coupling the embedded chip to the outside world, possibly on both sides of the framework. With reference to FIG. 9 a section of a panel 910 is shown having a polymer framework 916 around sacrificial copper stubs 912. Within the framework, there may be embedded copper vias 914. Furthermore, in order to minimize tooling costs, it is further possible to provide copper 917 sectioning elements within the polymer framework 916. These copper sectioning elements 917 may be bars as shown, or may be a continuous grid. The copper sectioning elements 917 and the vias 914 may be shielded whilst the copper stubs 912 are exposed to an etchant and dissolved to create cavities, and, in subsequent processing the vias 914 may be shielded and the copper sectioning elements may be exposed to an etchant. In this way, a polymer framework 916 with cavities may be provided for receiving dice for further processing and termination, and subsequently singulated by etching away copper sectioning elements 917 therewithin. It will be appreciated that if the copper framework may be discontinuous to provide greater integrity to the polymer framework, and, on dissolving the copper part of the framework, there may be a need for some additional mechanical, laser or water cutting to fully singulate. If continuous, no further processing need be required to singulate individual packaged elements 920 consisting of a chip 922 or other active or passive component, cemented into a cavity 912 within a fiber reinforced package 920 that includes copper vias 914, by a polymer 924.

Persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

What is claimed:

1. A framework defining an array of rectangular cavities, each of said cavities for receiving a rectangular chip, said framework comprising a dielectric material comprising a polymer matrix with at least one of glass fibers and ceramic fillers embedded therein and the framework further comprising via posts embedded within the polymer matrix.

2. The framework of claim 1, wherein said cavities are substantially rectangular and are fabricated to within tolerances of +−25 microns.

3. The framework of claim 1, wherein walls of said cavities are substantially perpendicular to the framework.

4. The framework of claim 1, wherein corners of said rectangular cavities have a radius of curvature of less than 100 microns.

5. The framework of claim 1, wherein corners of said rectangular cavities have a radius of curvature of less than 50 microns.

6. The framework of claim 1 wherein said polymer matrix is polyimide, epoxy or BT (Bismaleimide/Triazine) or their blends.

7. The framework of claim 1 further comprising elongated sacrificial copper sectioning elements that are etchable to assist singulation of the framework.

8. The framework of claim 7 wherein the elongated sacrificial copper sectioning elements cross each other to form a framework.

9. The framework of claim 1 wherein the cavities may have dimensions in the range of from about 0.9 mm×0.9 mm, up to about 31×31 mm.

10. The framework of claim 1 having a depth in the range of 50 microns to 300 microns.

11. The framework of claim 1 wherein each cavity has a depth of 20-50 microns more than the height of the chip to be placed therewithin.

12. The framework of claim 1 wherein said framework is diceable by a technique selected from the group of mechanical tooling, laser tooling and water jet tooling.

13. The framework of claim 1 wherein each cavity has a depth of at least 10 microns more than the height of the chip to be placed therewithin.

14. A method for creating an array of cavities in a plate of dielectric material comprising pressing sheets of the dielectric material over a sacrificial array of metal stubs under heat and pressure and then etching away the metal stubs.

15. The method of claim 14 wherein the dielectric material comprises a polymer matrix.

16. The method of claim 14, wherein the dielectric material further comprises glass fibers.

17. The method of claim 14, wherein the dielectric material comprises a pre-preg of woven glass fiber bundles impregnated with the polymer matrix.

18. The method of claim 14 wherein the metal stubs comprise copper.

19. The method of claim 14 wherein the metal stubs are fabricated by:
   (i) obtaining a continuous copper layer on a barrier metal substrate;
   (ii) applying a layer of photoresist;
   (iii) patterning the layer of photoresist, and
   (iv) etching away the copper, using the patterned layer of photoresist as a stencil.

20. The method of claim 14 wherein the metal stubs are fabricated by:
(a) applying a layer of photoresist over a barrier metal substrate;
(b) patterning the layer of photoresist;
(c) electroplating copper into the patterned photoresist;
(d) removing the photoresist.

21. The method of claim 14 wherein the cavities are characterized by having substantially parallel smooth edges that meet at corners having a radius of curvature of etching away the copper, using the patterned layer of photoresist as a stencil.

22. The method of claim 15, wherein corners of said cavities have a radius of curvature of less than 100 microns.

23. The method of claim 13, wherein corners of said cavities have a radius of curvature of less than 50 microns.

24. The method of claim 13, wherein dimensions of said cavities are fabricable within a tolerance of +−25 microns.

25. The method of claim 14, wherein copper vias are codeposited with the stubs, and embedded in walls of said plate, the copper vias being masked as the stubs are etched away.

26. The method of claim 25 wherein elongated copper sectioning elements are codeposited with the copper stubs and vias and embedded in the walls of the plate.

27. The method of claim 26 wherein the copper sectioning elements are etched away whilst the vias are shielded, thereby aiding singulation of the plate.

28. A chip embedded in a dielectric frame comprising a polymer resin and reinforcing fibers, wherein the dielectric frame is characterized by adjacent smooth walls without protruding fibers that meet at a vertex characterized by a radius of curvature of less than 100 microns, the space between the chip and the surrounding frame being filled with a filler material.

29. The chip of claim 28 wherein the filler material is applied as a molding compound, a dry film or a pre-preg.

30. The chip of claim 28 wherein the dielectric frame further comprises copper vias.

31. A framework defining an array of rectangular cavities, each of said cavities for receiving a rectangular chip, said framework comprising a dielectric material having a polymer, wherein said cavities are substantially rectangular and are fabricated to within tolerances of +−25 microns.

32. A framework defining an array of rectangular cavities, each of said cavities for receiving a rectangular chip, said framework comprising a dielectric material having a polymer, wherein corners of said rectangular cavities have a radius of curvature of less than 100 microns.

33. A framework defining an array of rectangular cavities, each of said cavities for receiving a rectangular chip, said framework comprising a dielectric material having a polymer, wherein said dielectric material further comprises at least one of ceramic and glass fibers.

34. A framework defining an array of rectangular cavities, each of said cavities for receiving a rectangular chip, said framework comprising a dielectric material having a polymer matrix, comprising a polymer selected from the group consisting of polyimide, epoxy or BT (Bismaleimide/Triazine) or their blends, and at least one of glass fibers and ceramic fillers embedded in the polymer matrix and with via posts also embedded within the polymer matrix.

35. A framework defining an array of rectangular cavities, each of said cavities for receiving a rectangular chip, said framework comprising a dielectric material having a polymer matrix, and further comprising elongated sacrificial copper sectioning elements that are etchable to assist with singulation of the framework.

36. The framework of claim 35 wherein the elongated sacrificial copper sectioning elements cross each other to form a framework.

37. A framework defining an array of rectangular cavities, each of said cavities for receiving a rectangular chip, said framework comprising a dielectric material having a polymer matrix with at least one of glass fibers and ceramic fillers embedded in the polymer matrix and further comprising via posts also embedded within the polymer matrix wherein said cavities are through cavities, open on both upper and lower surfaces of the framework.

* * * * *